US009928133B2

(12) United States Patent
Huang

(10) Patent No.: US 9,928,133 B2
(45) Date of Patent: *Mar. 27, 2018

(54) METHOD TO REDUCE READ ERROR RATE FOR SEMICONDUCTOR RESISTIVE MEMORY

(71) Applicant: ADVANCED INTEGRATED MEMORY INC., Cupertino, CA (US)

(72) Inventor: Andy Huang, Cupertino, CA (US)

(73) Assignee: Advanced Integrated Memory Inc., Cupertino, CA (US)

( * ) Notice: Subject to any disclaimer, the term of this patent is extended or adjusted under 35 U.S.C. 154(b) by 211 days.

This patent is subject to a terminal disclaimer.

(21) Appl. No.: 14/954,739

(22) Filed: Nov. 30, 2015

(65) Prior Publication Data
US 2016/0085613 A1   Mar. 24, 2016

Related U.S. Application Data

(63) Continuation of application No. 13/450,441, filed on Apr. 18, 2012, now Pat. No. 9,202,562.

(51) Int. Cl.
*G11C 11/00* (2006.01)
*G06F 11/07* (2006.01)
*G11C 13/00* (2006.01)
*G11C 11/16* (2006.01)

(52) U.S. Cl.
CPC ........ *G06F 11/0793* (2013.01); *G06F 11/073* (2013.01); *G06F 11/0751* (2013.01); *G11C 11/1673* (2013.01); *G11C 11/1675* (2013.01); *G11C 13/004* (2013.01); *G11C 2013/0054* (2013.01)

(58) Field of Classification Search
CPC .............. G11C 13/0069; G11C 13/004; G11C 11/1675; G11C 11/1673; G11C 13/0097; G11C 2013/0054; G11C 2013/0073; G11C 2013/0045; G11C 2013/0076
See application file for complete search history.

(56) References Cited

U.S. PATENT DOCUMENTS 9,202,562 B2 * 12/2015 Huang ................ G11C 13/004

* cited by examiner

*Primary Examiner* — Hien Nguyen
(74) *Attorney, Agent, or Firm* — Kilpatrick Townsend & Stockton LLP

(57) ABSTRACT

A method for operating a memory device includes performing a single read operation that includes additional one or more combinations of read and/or write cycles, and performing a single write operation that includes additional one or more combinations of read and/or write cycles. For example, a method for auto-correcting errors in a memory device having plurality of memory cells includes performing a first read operation of the memory cell to obtain a first read data value, performing a first write operation to the memory cell to write a second data value, which is a complement of the first data value, into the memory cell, performing a second read operation of the memory cell to obtain a third data value, and performing a second write operation to the memory cell to write a fourth data value, which is a complement of the third data value, to the memory cell.

20 Claims, 7 Drawing Sheets

Magnetic Random Access Memory (MRAM) cell

Magnetic Tunnel Junction (MTJ)

Effective MTJ Resistance

Write electrical current for MTJ

Determine the effective MTJ resistance and effective MTJ electrical current;

Sense Amplifier (SA) determines the data output

Non-Overlapped Imtj Distribution

Non-Overlapped Rmtj Distribution

Overlapped Imtj Distribution

Overlapped Imtj Distribution with additional Iref

Additional regions as a result of additional Iref

METHOD TO REDUCE READ ERROR RATE FOR SEMICONDUCTOR RESISTIVE MEMORY

CROSS-REFERENCES TO RELATED APPLICATIONS

This application is a continuation application of U.S. patent application Ser. No. 13/450,441 filed Apr. 18, 2012, the content of which is incorporated by reference herein in its entirety.

BACKGROUND OF THE INVENTION

The present invention relates to semiconductor memory devices, and in particular to a semiconductor resistive memory device such as Magnetic or Magnetoresistive Random Access Memory (MRAM), Phase Change memory (PCM), Resistance memory (RRAM) etc.

The nonvolatile MRAM with Spin Transfer Torque (STT) programming has become a topic of great interest. This SST MRAM can be manufactured with the Complementary Metal Oxide Semiconductor (COMS) technology for both the embedded application as well as the stand alone memory device. MRAM combines the desirable attributes of today's memory technologies such as the volatile Static Random Access Memory (SRAM), Dynamic Random Access Memory (DRAM), and the Non-volatile Flash Memory. Some of the key attributes are fast access time, random address selection, low cost, high density, and non-volatility.

However, conventional MRAM suffers from many limitations as will be described below. Therefore, techniques for improving operations of MRAM are highly desired.

BRIEF SUMMARY OF THE INVENTION

The inventor have observed that one of the major obstacles of MRAM production is the relative high occurrence of read operation failures. Read operation failures occur when the read current distribution includes overlapped shapes of 0 and 1 states. These overlapped read current distribution occurs more likely in advanced processes, smaller geometries, or in high density memory devices.

In some embodiments of the present invention, methods are provided for embedding a series combination of read and/or write cycles into the original read operation. In some embodiment, one or more read and/or write cycles are embedded into the original read operation. In some embodiments of present invention, we propose to divide the single read current distribution regions into more finite and smaller regions. This can be achieved by defining additional electrical reference current source (Iref) during a read operation with the sense amplifier.

A further understanding of the nature and advantages of the present invention may be realized by reference to the remaining portions of the specification and the drawings.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

The present invention relates to semiconductor memory devices, and in particular to a semiconductor resistive memory device such as Magnetic or Magnetoresistive Random Access Memory (MRAM), Phase Change memory (PCM), Resistance memory (RRAM). etc.

The nonvolatile MRAM with Spin Transfer Torque (STT) programming has become a topic of great interest. However, variations in process parameters can lead to a large number of cell failures, severely affecting the yield of memory arrays. This invention teaches a solution to improve the memory array yield due to the variation of process parameters.

MRAM Cell Structure

Figure 1:
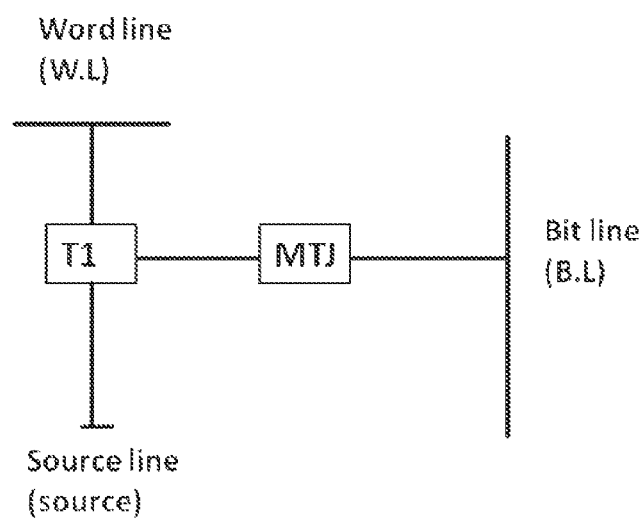
FIG. 1 is a schematic drawing illustrating a Magnetic Random Access Memory (MRAM) cell according to one embodiment of the present invention.

FIG. 1 is a schematic drawing illustrating of a Magnetic Random Access Memory (MRAM) cell according to an embodiment of the present invention. As shown in FIG. 1, the MRAM cell contains a switch device (T1) and Magnetic tunnel junction (MTJ). There are three terminals coupled to three electrically conductive lines, the word line (W.L), the Bit line (B.L) and Source Line (Source). The switch device normally can be Metal Oxide Semiconductor (MOS) transistor (n-channel MOS (nMOS), p-channel MOS (pMOS), or both in CMOS)

Figure 2:
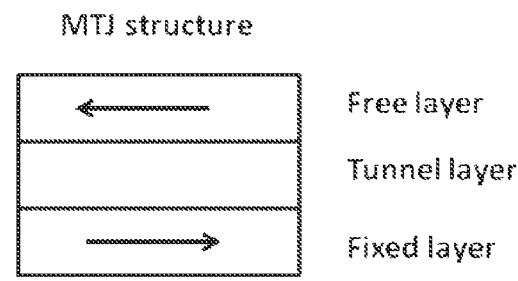
FIG. 2 is a cross-sectional drawing illustrating a magnetic tunnel junction (MTJ) according to one embodiment of the present invention.
Figure 3:
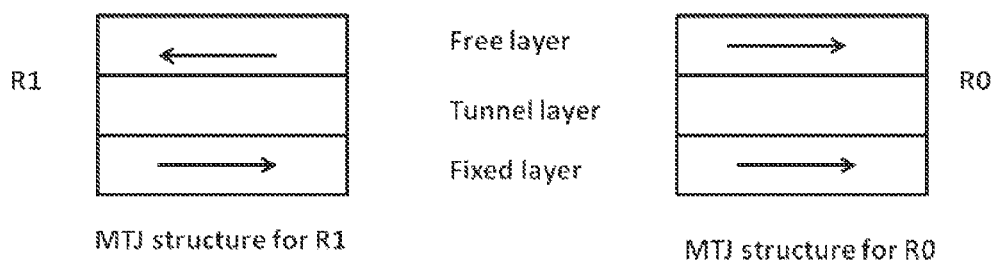
FIG. 3 is a cross-sectional drawing illustrating effective MTJ resistances according to one embodiment of the present invention.
Figure 4:
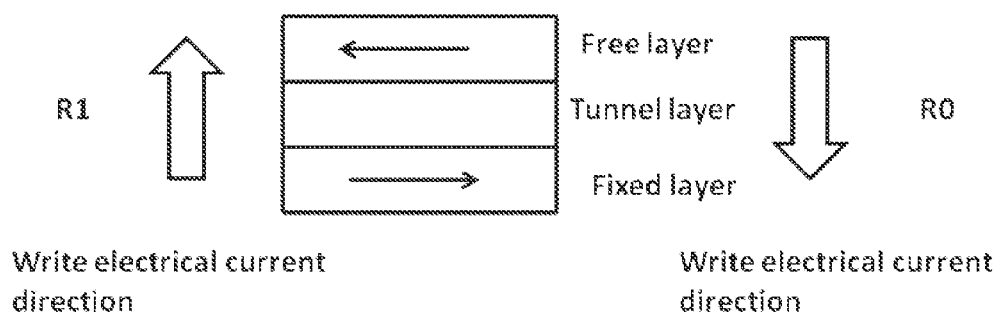
FIG. 4 is a drawing illustrating write electrical currents for MTJ according to one embodiment of the present invention.

FIG. 2 is a cross-sectional drawing illustrating a magnetic tunnel junction (MTJ) according to one embodiment of the present invention. A fundamental MTJ contains three basic layers as shown FIG. 2. It consists of two ferromagnetic layers separated by a thin tunnel dielectric layer. The lower layer is "fixed" implying that its magnetic orientation cannot be changed during operation, whereas the magnetic orientation of the upper "free" layer can be changed. By controlling the direction of the write electrical current through the MTJ, the MTJ resistance can be changed as shown in FIG. 3 and FIG. 4. FIG. 3 is a cross-sectional drawing illustrating effective MTJ resistances according to one embodiment of the present invention. FIG. 4 is a drawing illustrating write electrical currents for MTJ according to one embodiment of the present invention. The effective MTJ resistance of the anti-parallel state is R1, and the effective MTJ resistance of the parallel state is R0. Based on the Magnetoresistance Ratio (MR), R1 is the product of R0 times the sum of 1 and MR (R1=R0(1+MR)).

MRAM Read Operation

The MRAM read operation is performed by sensing the different MTJ effective resistance (R1 or R0) to generate logic data "1" (data_1) or logic data "0" (data_0) respectively.

Figure 5:
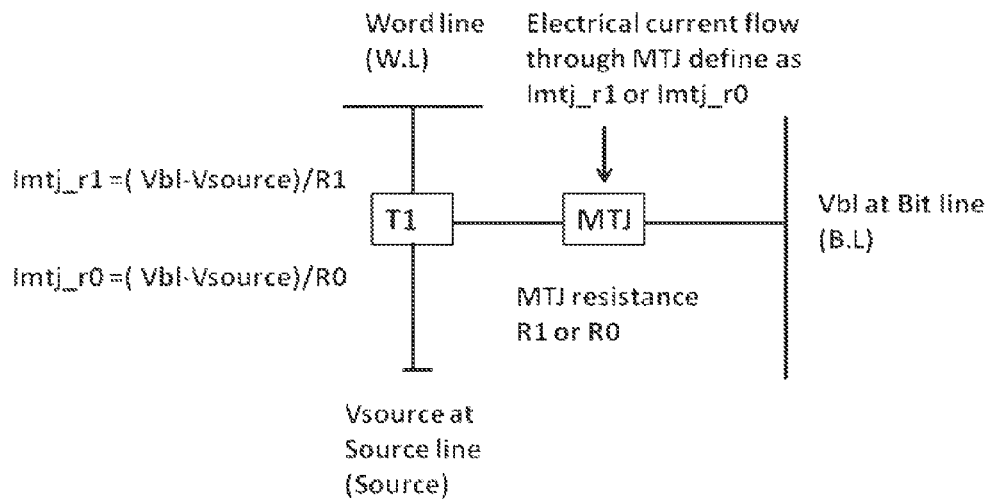
FIG. 5 is a drawing illustrating a method of determining the effective MTJ resistance and effective MTJ electrical current according to one embodiment of the present invention.

FIG. 5 is a drawing illustrating a method of determining the effective MTJ resistance and effective MTJ electrical current according to one embodiment of the present invention. One way to sense the MTJ effective resistance (Rmtj) is to sense the electrical current flow through the MTJ by using a bias voltage between the bit line (Vbl) and the source line (Vsource), and then turn on the switch device (T1) as shown on FIG. 5.

Figure 6:
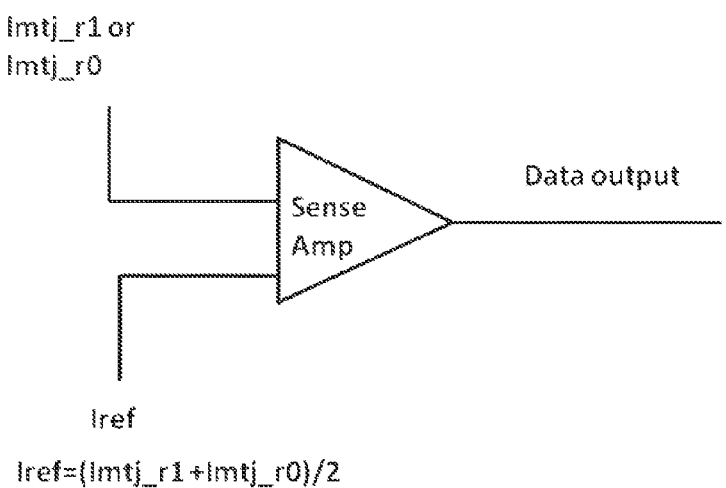
FIG. 6 is a drawing illustrating a sense amplifier (SA) that determines the data output according to one embodiment of the present invention.
Figure 7:
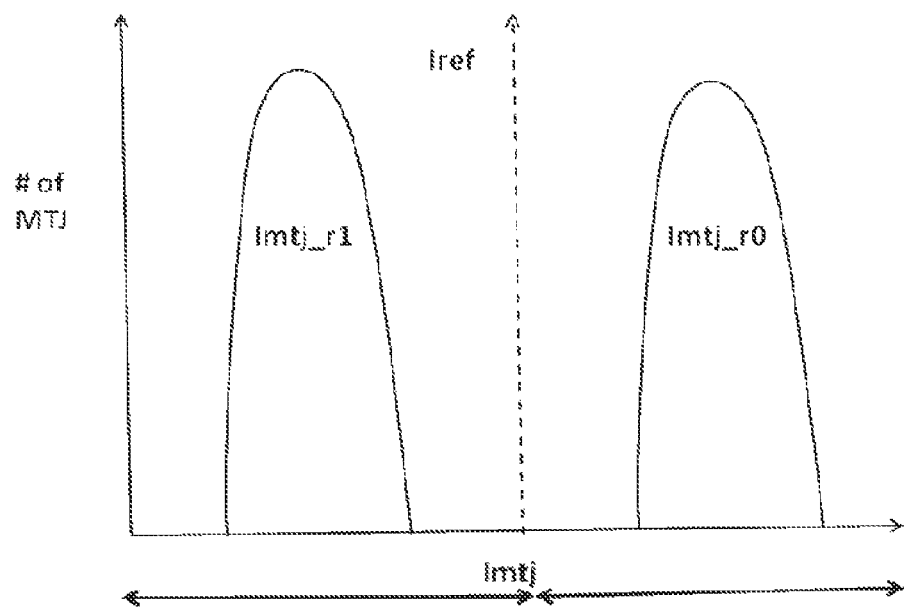
FIG. 7 is a drawing illustrating an example of non-overlapped read current Imtj distribution according to one embodiment of the present invention.
Figure 8:
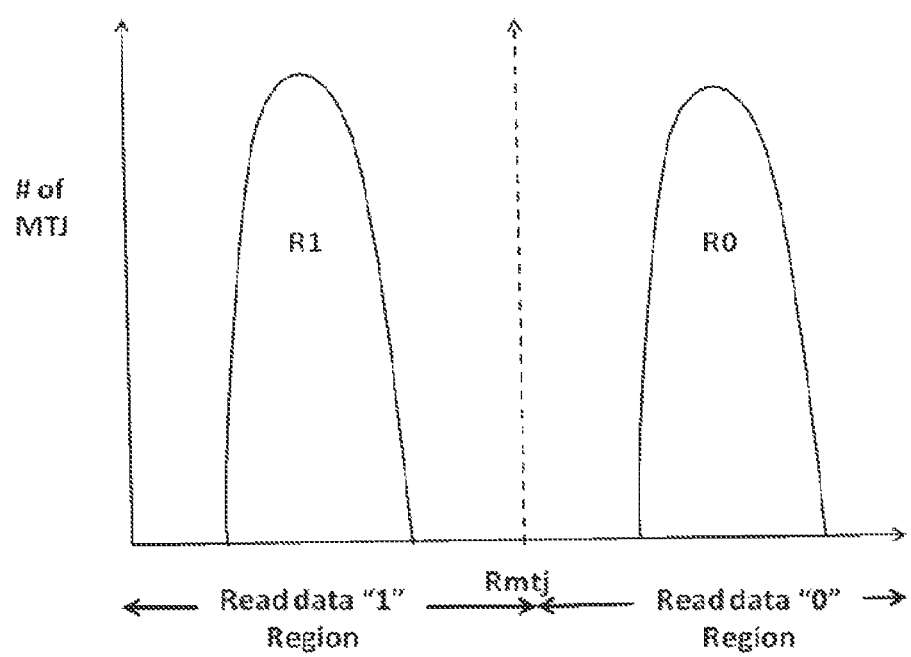
FIG. 8 is a drawing illustrating an example of non-overlapped read resistance Rmtj distribution according to one embodiment of the present invention.

FIG. 6 is a drawing illustrating a sense amplifier (SA) that determines the data output according to one embodiment of the present invention. The electrical current sense amplifier (SA) determines the output data by comparing the MTJ electrical current (Imtj) with a suitable reference electrical current (Iref) as shown FIG. 6. In most cases, the Iref is chosen as half of the sum of Imtj_r1 and Imtj_r0, (½ (Imtj_r1+Imtj_r0)), in order to achieve the largest read sensing margin. The sense amplifier will sense the electrical current difference between Imtj_r1 (or Imtj_r0) and Iref to output the logic data "1" or "0" respectively. FIG. 7 is a drawing illustrating an example of non-overlapped Imtj distribution according to one embodiment of the present invention. An ideal relationship between Iref, Imtj_r1, and Imtj_r0 would be that the possible range (distribution) of Imtj_r0 and Imtj_r1 are not overlapped (Non-Overlapped) as shown in FIG. 7. FIG. 8 is a drawing illustrating an example of non-overlapped Rmtj distribution according to one embodiment of the present invention. Since the MTJ electrical current is proportional to the MTJ resistance, FIG. 7 can be redrawn as FIG. 8 by replacing Imtj with Rmtj. The MRAM read operation margin will be better if there are large separation region between Imtj_r1 and Imtj_r0, or a narrow distribution region of Imtj_r1 and Imtj_r0.

MRAM Write Operation

The MRAM write operation is achieved by applying different bias voltages between the Free layer and the Fix layer. The effective MTJ resistance can switch between R1 and R0 respectively by the opposite directions of electrical current through MTJ. In nother words, input data_1 (R1) and data_0 (R0) can be written by applying the corresponding electrical current direction as FIG. 4. However, the data will not change if the same data is written again because the effective MTJ resistance (R1, R0), will not change if the same current direction is applied.

MRAM Yield and Reliability

It is general practice in the semiconductor memory industry to continue shrinking the size, or scaling, of the process technology every few years. Although the overall performance and cost of semiconductor memory device can be improved by scaling, statistical parametric variation is becoming a serious concern which may potentially cause failure of the MRAM core cell during read or write operation. The major sources of process variation in MTJ include but are not limited to, variations in tunneling oxide thickness and variation in MTJ cross-sectional area, etc.

These parameters affect the static as well as the dynamic behaviors of MTJ resulting in possible failure of memory cell, such as read failure and inability to write to the cell. The problem is further aggravated in scaled technology with the lithography challenges. As the key parameters of MTJ such as tunnel oxide thickness and cross section area continue to shrink in more advanced processes, the variation of those key MTJ parameters varies significantly even with a slight change of process window. Consequently, designing and manufacturing a high yield SST MRAM becomes a extremely challenging task.

MRAM Read Operation Failure

Figure 9:
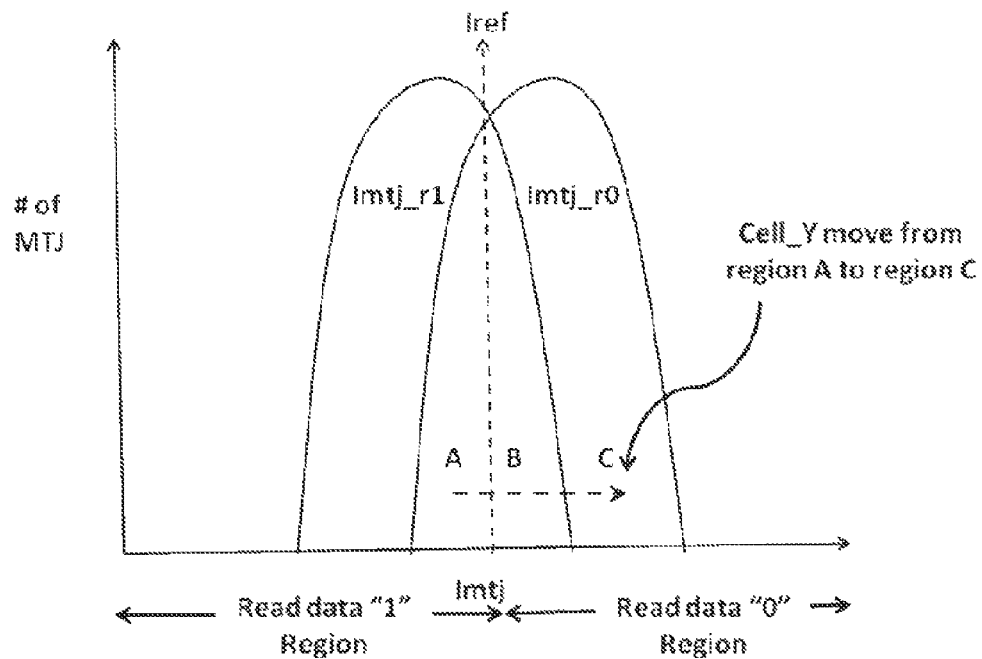
FIG. 9 is a drawing illustrating an example of overlapped read current Imtj distribution according to one embodiment of the present invention.

FIG. 9 is a drawing illustrating an example of overlapped read current Imtj distribution according to one embodiment of the present invention. One of the major obstacles of MRAM production is the relative high occurrence of read operation failure. Read operation failure occurs when the Imtj distribution changes from non-overlapped shape as in FIG. 7 to an overlapped shape as in FIG. 9. These overlapped Imtj distribution occurs more likely in advanced processes, smaller geometries, or in high density memory devices.

As shown in FIG. 7, Imtj_r1 represents the electrical current of a memory cell which will be written with logic data "1" (data_1), and Imtj_r0 represents the electrical current of a memory cell which will be written with logic data "0" (data_0). Overlapped occurs when the left region of Imtj_r0 become less than Iref as shown in region A of FIG. 9; or when the right region of Imtj_r1 become more than Iref as in region B of FIG. 9. In another words, there are two type of cells located in region A of FIG. 9, one was written with logic data "1" and the other was written with logic data "0". Since the electrical current through MTJ(Imtj) of those two cells are less than Iref, the read operation output data of those two cells will be logic data "1" regardless of the original data content. The same behavior also occurs in region B of FIG. 9 where the two type of cells read operation output data will be logic data "0" regardless of the original data content. This incorrect read operation output due to the overlapped distribution region as shown at FIG. 9 is commonly known as read operation failure.

MRAM Read Operation Failure Solution

Figure 10:
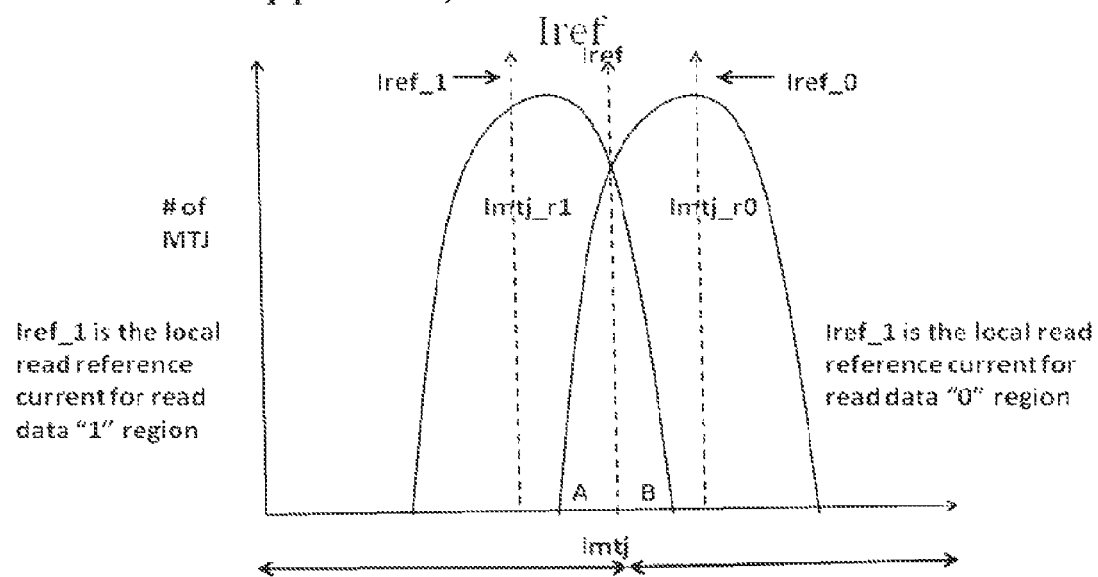
FIG. 10 is a drawing illustrating a method for resolving overlapped read current Imtj distribution with additional reference current Iref according to one embodiment of the present invention.

FIG. 10 is a drawing illustrating a method for resolving overlapped Imtj distribution with additional Iref according to one embodiment of the present invention. In embodiments of the present invention, methods is provided for embedding a series combination of read and/or write cycles into the original read operation. In an embodiment, one or more read and/or write cycles are embedded into the original read operation.

Assume there are two memory cells with different address locations, but both cells are located at the region A of FIG.

9. One cell (Cell_X) has been written logic data "0", while the other cell (Cell_Y) has been written logic data "1". In the normal non-overlapped case as shown in FIG. 7, the output of read operation from Cell_X shall be data "0" and the read output from Cell_Y shall be data "1". However, if these two cells are located in the overlapped region A as in FIG. 9, then the Imtj of these two cells are less than Iref, and the read output of those two cells will be logic data "1" regardless of the original input written data. In other words, read operation failure for Cell_X occurs when its Imtj is in the overlapped region A, and vice versa for Cell_Y where read operation failure occurs when its Imj is in the overlapped region B.

The inventor of this invention has recognized that the resistance of MTJ will not change if same data is to be written again to the same cell after its read operation. When necessary, in an embodiment, we propose to add a write cycle (1st write) to the same cell after the read (1st read) cycle. The input data (Data_W_1) for this 1st write cycle can be the same as or complementary to the output data (Data_R_1) of the 1st read cycle.

When necessary, we propose to add another read cycle (2nd read) after the 1st write cycle. We also propose to perform a logic operation by adding a data comparison cycle between the output data from the 1st read cycle (Data_R_1) and the output data from the 2nd read cycle (Data_R_2).

As mentioned before, the resistance of MTJ will not change if the same data is written again. Using Table A as an example, Cell_X has read an incorrect read output data "1" in column 2, and will not change its data content "0" after the 1st write cycle in column 3 due to the fact that same data as the original data in column 1 was written. Since the data content of Cell_X does not change, it also means the Imtj_r1 of this Cell_X will not change. Since the Imtj_r1 of Cell_X stays the same, this cell still remains in the same region A as FIG. 9. By performing a 2nd read cycle as in column 4 and a comparing cycle with the written data in column 3, we can determine a read failure has occurred for Cell X. However, Cell_Y at Table A will have a complete different behavior. As data "0" in column 3 is being written during the 1st write cycle, the data content of Cell_Y will change from data "1" to data "0", and so will the corresponding Imtj. The Imtj of Cell_Y changes from the Imj_r1 region to the Imtj_r0 region as shown in FIG. 9. In another word, the Imtj of Cell_Y has moved from the overlapped region A in FIG. 9 to the non-overlapped region C in FIG. 9. By performing a 2nd read cycle as in column 4, then a correct output data (Data_Final) in column 5 can be generated. In this case, the correct output data (Data_Final) in column 5 is the logic inversion of the data output of the 2nd read cycle (Dtat_R_2) in column 4. Table B represents a similar example for Cell_X and Cell_Y when the data content is in region B.

When necessary, we propose to add another write cycle (2nd write) after the 2nd read cycle in order to restore the original data back to the cell if the complementary data is to be written in column 3. Table A and Table B provide the samples to show the sequence of a method according to an embodiment of present invention. It demonstrates the final read output data (Data_final) in column 5 is the inversion of the data output of the 2nd read cycle (Data_R_2) in column 4. More importantly, the final read output data in column 5 is correct compares to the original input data in column 1, and any read failure will be corrected.

TABLE A

Cell_X and Cell_Y in the Region A in FIG. 9.

| Cell name | 1 Original data | 2 Output data from the 1st read cycle Data_R_1 | 3 Write data in the following write cycle (1st write cycle) Data_W_1 | 4 Output data from the 2nd read cycle Data_R_2 | 5 Final data output Data_Final |
|---|---|---|---|---|---|
| Cell_X | 0 | 1 | 0 | 1 | 0 |
| Cell_Y | 1 | 1 | 0 | 0 | 1 |

TABLE B

Cell_X and Cell_Y in the Region B in FIG. 9.

| 1 Cell name | 1 Original data | 2 Output data from the 1st read cycle Data_R_1 | 3 Write data in the following write cycle (1st write cycle) Data_W_1 | 4 Output data from the 2nd read cycle Data_R_2 | 5 Final data output Data_Final |
|---|---|---|---|---|---|
| Cell_X | 0 | 0 | 1 | 1 | 0 |
| Cell_Y | 1 | 0 | 1 | 0 | 1 |

Increase MRAM Manufacture Margin and Process Window

Figure 11:
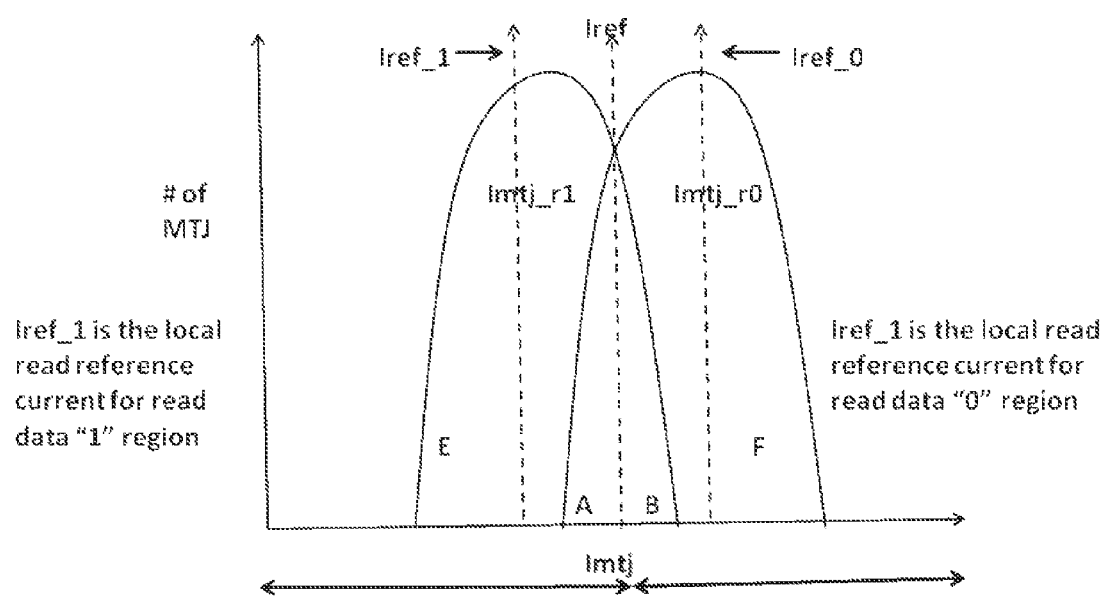
FIG. 11 is a drawing illustrating additional regions as a result of additional reference current Iref according to one embodiment of the present invention.
Figure 12:
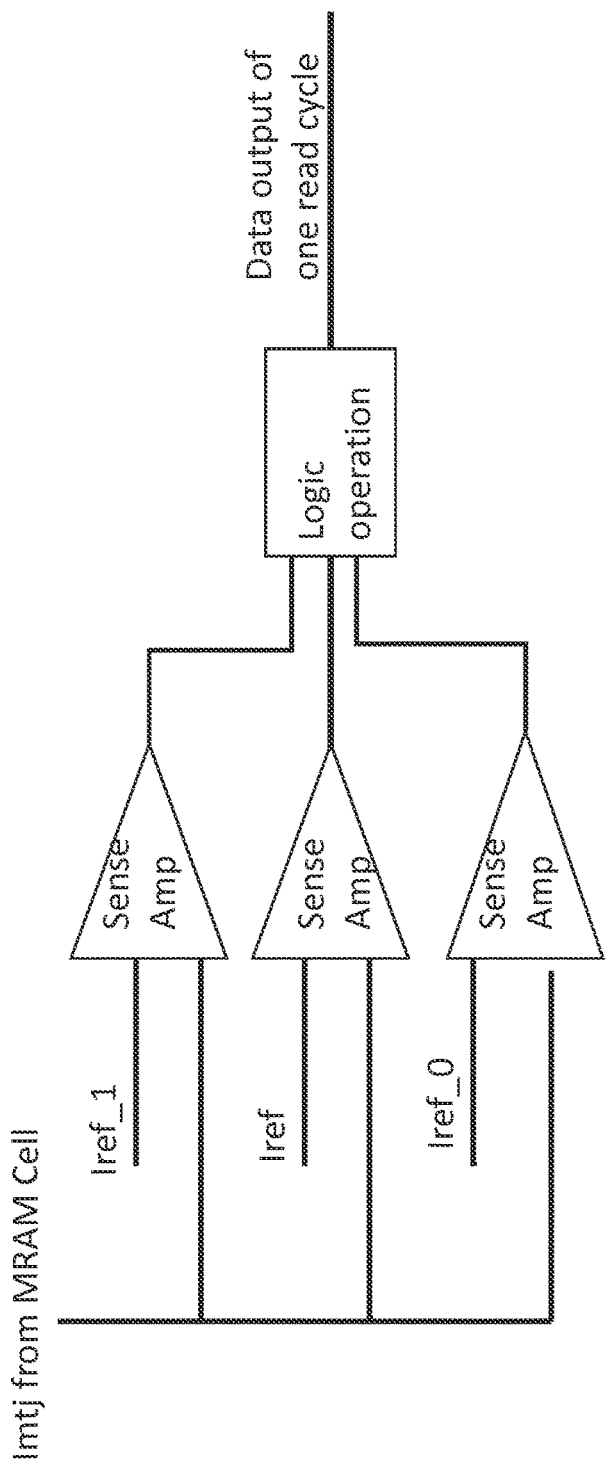
FIG. 12 is a drawing illustrating a method for performing read cycles in parallel according to one embodiment of the present invention.

In order to widen the MRAM process window to gain the manufacture margin, we could take advantage of more finite differences of the MTJ resistance regions. In some embodiments of present invention, we propose to divide the single Imtj distribution regions into more finite and smaller regions. This can be achieved by defining additional electrical reference current sources (Iref) during a read operation with the sense amplifier as in FIG. 6. In other words, we propose to define additional electrical reference current (Iref_1, and Iref_2) as in FIG. 10. As shown in FIG. 11, more finite distribution regions (region E and region F) can now be defined as a result of the additional Iref_1 and Iref_2. Region E is the read data "1" region that is on the left side of Iref_1; while region F is the read data "0" region that is on the right side of Iref_2. All of the additional Iref (Iref_1, Iref_2, Iref_3 . . . etc) can be applied to the read cycle (1st read, 2nd read, 3rd read . . . etc) in this invention. In addition, all of the Iref read cycles can be performed in parallel in order to reduce the read access time as in FIG. 12.

References throughout this specification to "one embodiment," "an embodiment," or similar language mean that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for auto-correcting errors in a memory device having plurality of memory cells, the method comprising:
   selecting a memory cell using a cell address;
   performing a first read operation of the memory cell to obtain a first read data value;
   performing a first write operation to the memory cell to write a second data value into the memory cell, the second data value being a complement of the first data value;
   performing a second read operation of the memory cell to obtain a third data value; and
   performing a second write operation to the memory cell to write a fourth data value to the memory cell, the fourth data value being a complement of the third data value.

2. The method of claim 1, where any of the first to fourth data values corresponds to a logic value of 1 or 0, and the complement of a data value corresponds to a logic value of 0 or 1, respectively.

3. The method of claim 1, wherein the memory device is an MRAM (Magnetic or Magnetoresistive Random Access Memory) device.

4. The method of claim 1, wherein the method is performed by a memory control circuit.

5. The method of claim 1, wherein the method is performed by a memory tester.

6. The method of claim 1, wherein the first read data value and the second read data value are determined with respect to a single reference value.

7. The method of claim 1, wherein the second data value and the fourth data value are determined with respect to two or more reference values.

8. The method of claim 7, wherein the method is performed with respect to two or more reference vales in parallel.

9. A method for auto-correcting errors in a memory device having a plurality of memory cells, the method comprising:
   performing a first write operation to write a first data value into a memory cell;
   performing a first read operation of the memory cell to obtain a second data value;
   comparing the second data value with the first data value; and
   if the second data value is different from the first data value, performing a second write operation to the memory cell to write a third data value into the memory cell, the third data value being a complement of the first data value.

10. The method of claim 9, where any of the first to third data values corresponds to a logic value of 1 or 0, and the complement of a data value corresponds to a logic value of 0 or 1, respectively.

11. The method of claim 9, wherein the memory device is an MRAM (Magnetic or Magnetoresistive Random Access Memory) device.

12. The method of claim 9, wherein the second data value and the fourth data value are determined with respect to two or more reference values.

13. In a semiconductor nonvolatile memory device including a plurality of memory arrays in a matrix, a method for operating the memory device comprises:
   performing a single read operation, wherein the single read operation includes additional one or more combinations of read and/or write cycles; and
   performing a single write operation, wherein the single write operation includes additional one or more combinations of read and/or write cycles.

14. The method of claim 13, wherein the memory device is an MRAM (Magnetic or Magnetoresistive Random Access Memory) device.

15. The method of claim 13, wherein performing the single write operation comprises writing a data value that is a complementary of a data value obtained in an additional read operation in the single read operation.

16. A method for auto-correcting errors in a memory device having a plurality of memory cells, the method comprising:
   performing a first read operation of a memory cell to obtain a first signal value;
   comparing the first signal value with a first threshold value and a second threshold value, the second threshold value being higher than the first threshold value;
   if the first signal value is below the first threshold value, determining that the memory cell is in a first logic state; and
   if the first signal value is above the second threshold value, determining that the memory cell is in a second logic state.

17. The method of claim 16, wherein if the first signal value is between the first threshold value and the second threshold value, performing the following operations to determine the logic state of the memory cell:
   comparing the first signal value with a third threshold value, which is between the first threshold value and the second threshold value;
   if the first signal value is below the third threshold value, determining that a first data value is in a first logic state;
   if the first signal value is above the third threshold value, determining that the first data value is in a second logic state;
   performing a first write operation to the memory cell to write a second data value into the memory cell, the second data value being a complement of the first data value;
   performing a second read operation of the memory cell to obtain a third data value;
   performing a second write operation to the memory cell to write a fourth data value to the memory cell, the fourth data value being a complement of the third data value;
   determining that the memory cell is in the first logic state or the second logic state according to the logic state of the fourth data value.

18. The method of claim 17, wherein the memory device is an MRAM (Magnetic or Magnetoresistive Random Access Memory) device.

19. The method of claim 17, wherein comparisons with the first, the second, and the threshold values are performed in parallel.

20. The method of claim 17, wherein the method is performed by a memory control circuit.

* * * * *